United States Patent [19]

Darrow

[11] Patent Number: 4,641,045
[45] Date of Patent: Feb. 3, 1987

[54] FAIL-SAFE ONE AND ONLY ONE SIGNAL CHECKING CIRCUIT

[75] Inventor: John O. G. Darrow, Murrysville, Pa.

[73] Assignee: American Standard Inc., McCandless Township, Allegheny County, Pa.

[21] Appl. No.: 670,243

[22] Filed: Nov. 13, 1984

[51] Int. Cl.[4] .............................................. H03K 5/153
[52] U.S. Cl. .................... 307/350; 307/355; 307/362
[58] Field of Search ............... 307/354, 355, 360, 362, 307/350; 330/124 D

[56] References Cited

U.S. PATENT DOCUMENTS

| | | | |
|---|---|---|---|
| 3,376,434 | 3/1968 | Darrow | 307/355 |
| 3,492,589 | 1/1970 | Rotier | 307/355 |
| 3,497,720 | 2/1970 | Slawson | 307/354 |
| 3,604,949 | 9/1971 | Conzelmann et al. | 307/362 |

Primary Examiner—John Zazworsky
Attorney, Agent, or Firm—J. B. Sotak

[57] ABSTRACT

A vital checking circuit for assuring the reception of only one input signal including a differential amplifier having a pair of PNP transistors. A voltage divider having a first and a second biasing resistor connected to the input of one of the pair of transistors. An a.c. signal transformer coupled to the input of the one of the pair of transistors. A third biasing resistor connected to the input of the other of the pair of transistors. A plurality of current-drawing circuits connected to the third biasing resistor, and an a.c. output signal derived from the other of the pair of transistors when and only when one of the plurality of current-drawing circuits is drawing current through the third biasing resistor.

10 Claims, 1 Drawing Figure

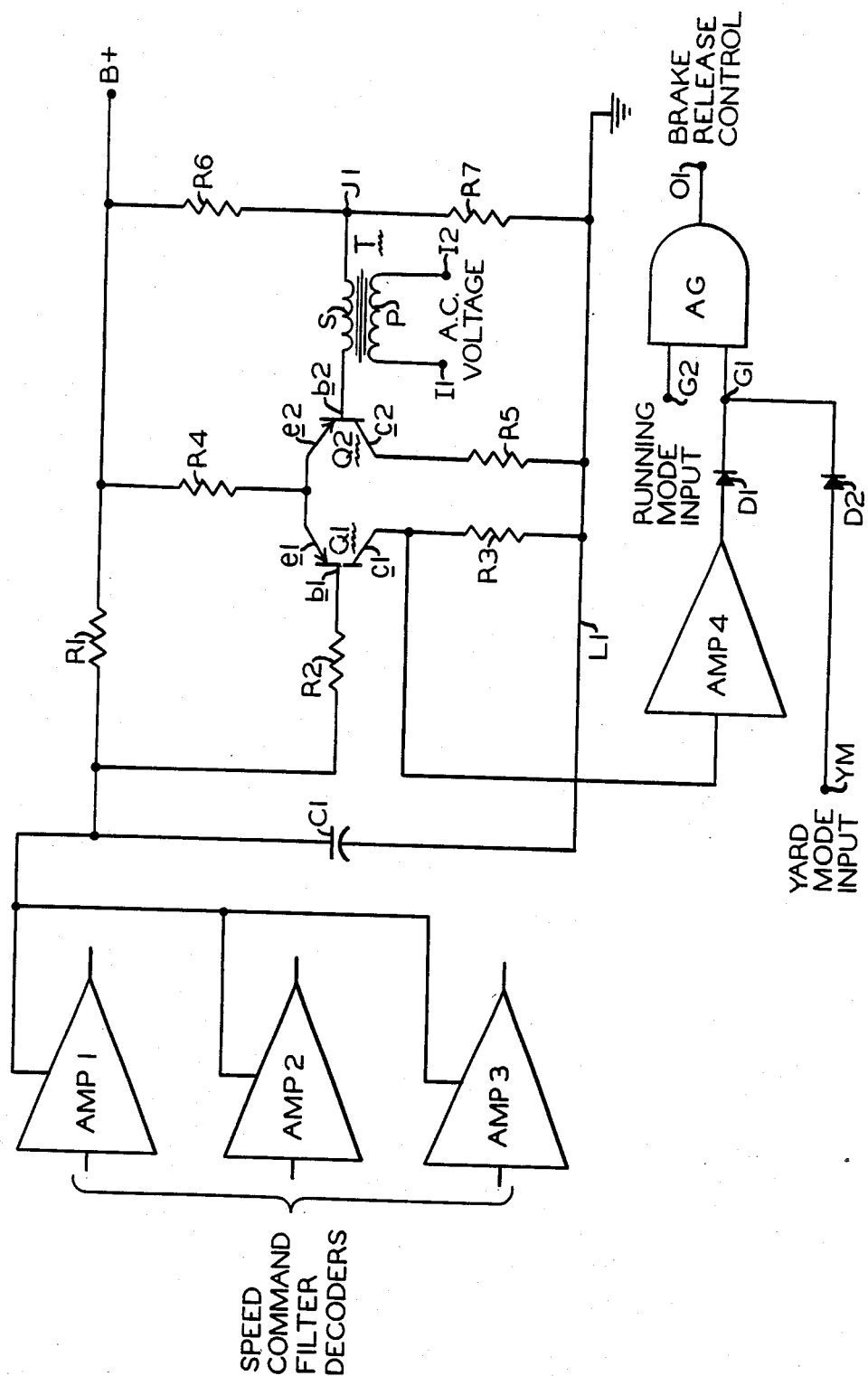

FAIL-SAFE ONE AND ONLY ONE SIGNAL CHECKING CIRCUIT

FIELD OF THE INVENTION

This invention relates to a vital checking circuit for assuring the presence of only a single signal and, more particularly, to a coded cab signal sensing circuit which is responsive to the reception of only one of a plurality of possible speed command signals for causing the release of the brakes of a railway vehicle.

BACKGROUND OF THE INVENTION

In certain railway control systems, such as, in coded cab signal speed command control apparatus, it is mandatory to ensure that a component or circuit failure is incapable of endangering the safety and security of the crewmen and/or passengers and will not result in damage and/or destruction of the equipment. Thus, it is essential to exercise extreme care in designing the circuitry and in selecting the components of the electronic cab signal equipment to ensure fail-safe operation. For example, it is necessary to test and evaluate each and every foreseeable and possible malfunction that may occur in a vital system in order to guarantee reliable and safe operation. For instance, under no circumstance should the speed of a train exceed the authorized speed command received from the wayside apparatus. In practice, the car-carried receiving equipment includes a bank of frequency sensitive coding filters for determining which one of the plurality of coded speed command signals is being picked up from the wayside transmitter. The cab signal receiver also includes a speed governor which has various inputs energizable by the decoding filters and which is responsive to a frequency that is proportional to the actual speed of the vehicle. The actual speed of the vehicle is compared to the desired speed represented by coded speed command, and if the actual speed is equal to or under the desired speed, the brakes are held in their released position. It will be appreciated that each of the decoding filters is designed in such a manner that it is impossible to produce a false output even during a circuit failure. Thus, the vitality of the system is based upon the safe operation of the decoding filters. In some cab signal systems, as an added assurance that if two decoding filters are energized simultaneously, which may occur during speed command changes in some cases, then it is a customer requirement that the train not respond to either of the coded signals. In some cases, the speed governor is designed to cope with such a situation but in other systems the problem remains unresolved.

OBJECTS AND SUMMARY OF THE INVENTION

Accordingly, it is an object of this invention to provide a new and improved fail-safe one and only one speed selector.

Another object of this invention is to provide a unique vital checking circuit for producing an output only during the presence of one of a plurality of inputs.

A further object of this invention is to provide a novel fail-safe electronic circuit for checking the voltage developed across a resistive element to ascertain whether or not a single coded input signal is being received on board a railway vehicle.

Yet another object of this invention is to provide a fail-safe checking circuit for assuring the presence of only a single input signal comprising, a differential amplifier having a pair of inputs and an output, a pair of biasing networks connected to respective ones of the pair of inputs, an a.c. signal induced into one of the pair of inputs to produce signal pulses on the output when the voltage-drops across the pair of biasing networks are substantially equal to each other.

Yet a further object of this invention is to provide a vital circuit for checking the reception of single signal comprising, a differential amplifier having a pair of transistors, a voltage divider having a first and a second biasing resistor connected to the input of one of the pair of transistors, an a.c. signal induced into the input of the one of the pair of transistors, a third biasing resistor connected to the input of the other of the pair of transistors, a plurality of current-drawing circuits connected to the third biasing resistor, and an output signal derived from the other of the pair of transistors when and only when one of the plurality of current-drawing circuits is drawing current through the third biasing resistor.

Still another object of this invention is to provide a vital single speed signal checking circuit comprising, a balanced PNP transistor differential amplifier, a first and a second series-connected resistor, the base electrode of one transistor of the differential amplifier is connected to the junction point of the first and second resistors for forwardly-biasing the one transistor, the base electrode of the other transistor of the differential amplifier is connected to a third resistor for forwardly-biasing the other transistor, an a.c. signal transformer coupled to the one transistor for developing an a.c. output signal on the collector electrode of the other transistor when and only when one of a plurality of speed signals is picked up by one of a plurality of amplifier-rectifiers, the a.c. output signal is fed to an amplifier whose output is connected to a diode for rectification to provide a d.c. input to a two-input AND gate.

BRIEF DESCRIPTION OF THE DRAWING

The foregoing objects and other attendant features and advantages will be more readily apparent and appreciated as the subject invention becomes more clearly understood by reference to the following detailed description when considered in conjunction with the accompanying drawing, wherein:

The single FIGURE is a schematic circuit diagram of fail-safe electronic single signal check circuit in accordance with the present invention.

DETAILED DESCRIPTION OF THE INVENTION

Referring now to the single FIGURE of the drawing, there is shown the vital or fail-safe solid-state checking circuit for ascertaining the presence of a single speed command signal being received by a cab signal receiver. In practice, the illustrated circuit is part of the apparatus which is carried on board the train as part of the speed control system. A bank of three speed command filter decoders receive a common input of the authorized speed command code signals from the wayside in a manner well known in the art. Each filter decoder unit is tuned or designed to selectively respond to a particular predetermined speed command within a designated range, received as a code signal which may be a unique alternating current frequency, a code pulse rate, or a unique code pattern. The details of the reception and decoding of the speed command are not critical to this present description and will be understood by those skilled in the art. In practice, the filtering decoders each includes a level detector in which the output is either ON or OFF depending upon receipt or absence of its particular code.

As shown, the signals from the speed command filter decoders are fed to the respective inputs of three amplifier-rectifier circuits designated AMP1, AMP2 and AMP3. Each one of the plurality of amplifiers supplies the respective rectifier portion, and is designed to draw a negligible amount of power supply current when there is no output, and which draws a known amount of current when an output is being produced. A four-terminal resistor (not shown) may be connected to the output of each of the three amplifier-rectifier circuits to safely control the output current to a known minimum value, unless a known load, such as a relay, is used. As shown, a filter capacitor C1 is connected between the outputs of the amplifier-rectifiers and ground line L1. The amount of current being drawn by the amplifier-rectifiers is checked by a balanced differential amplifier including PNP transistors Q1 and Q2. It will be seen that the first transistor Q1 includes a base electrode b1, a collector electrode c1, and an emitter electrode e1 while the second transistor Q2 includes a base electrode b2, a collector electrode c2, and an emitter electrode e2. A low-value current-sensing resistor R1 is interconnected between the positive supply terminal B+ and the power supply terminals of all of the amplifier-rectifiers. Thus, the resistor R1 is effectively in series with the current supply of all of the decoding filter output stages so that the voltage-drop across the resistor R1 will be a certain amount if only one decoding filter is operating, and will be more when two or more decoding filters are operating, and will be less or zero when no decoding filters are operating. It will be seen that the base electrode b1 is connected to the power terminals of the amplifier-rectifiers, which is one end of voltage biasing resistor R1, via coupling resistor R2. The collector electrode c1 is connected to ground lead L1 via load resistor R3. The emitter electrodes e1 and e2 are connected in common and are connected to the positive supply terminal +B via biasing resistor R4. The collector electrode c2 is connected to the ground lead L1 via resistor R5. The base electrode b2 is connected to the junction point J1 of a voltage divider via the secondary winding S of transformer T. The voltage divider biasing network includes a first resistor R6 and a second resistor R7. The upper end of resistor R6 is connected to the positive supply terminal +V while the lower end of resistor R7 is connected to ground lead L1. The input terminals I1 and I2 are connected to the primary winding P of transformer T which is connected to a suitable source of a.c. voltage.

As shown, the output collector electrode c1 is connected to the input of an amplifier AMP4. The output of amplifier AMP4 is connected to the anode electrode of a diode rectifier D1. The cathode electrode of the diode rectifier D1 is connected to one input G1 of a two-input AND gate AG. The other input G2 of the AND gate AG is connected to the brake release control apparatus of the cab signal equipment. Thus, an output signal is produced by the gate AG when both inputs are supplied to terminals G1 and G2 to release the vehicle brakes. Further, it will be understood that it is necessar to release the brakes in noncoded territory, such as, in yard operation. That is, a yard mode input YM is connected to input terminal G1 via diode rectifier D2 to permit vehicle movement within the confines of a storage yard. It is also understood that amplifier AMP4 and gate AG are constructed in a vital or fail-safe manner.

In describing the operation of the vital electronic speed checking circuit, it will be assumed that the circuit is intact and functioning properly, that the supply voltage is applied to the circuit, and that only one of the speed command signals is being picked up by the cab signal receiver. Thus, only one of the amplifier-rectifiers AMP1, AMP2 or AMP3 is drawing current from the supply voltage B+. Under this assumed condition, the amount of current flowing through resistor R1 causes a voltage-drop which is substantially equal to the voltage-drop developed across biasing resistor R6. Thus, under this balanced condition, the transistors Q1 and Q2 are alternately rendered conductive and nonconductive by the a.c. signals induced in the secondary winding S of the transformer T1. Thus, the a.c. signals developed on collector electrode c1 are fed to the amplifier AMP4, and the amplified signals are rectified by diode D1 to supply d.c. input to terminal G1 of AND gate AG. If a d.c. input signal also appears on terminal G2, an output signal will appear on terminal O1 to cause the release of the brakes to allow movement of the train along its route of travel.

Now let us assume that two or more speed command signals cause the energization of two or more of the amplifier-rectifiers AMP1, AMP2 and AMP3. It will be understood that during a change of speeds there is a slight overlapping period in which two of the amplifier-rectifiers may be simultaneously energized. In order to compensate for such transitory periods, a five (5) second delay is built into the AND gate AG before dropout occurs to apply the brakes. Thus, if two more more coded speed signals are picked up for a period longer than five (5) seconds, the excess current flowing through sensing resistor R1 will cause the biasing voltage of base electrode b1 to saturate the transistor Q1. Thus, a.c. input signals are no longer applied to amplifier AMP4 due to the saturation of transistor Q1. That is, the transformer-coupled a.c. input signals applied to terminals I1 and I2 are ineffective in developing a.c. signals on collector electrode c1 so that no a.c. input is available for amplifier AMP4. Hence, the d.c. input on terminal G1 ceases to exist, and after the five (5) second delay, the output on terminal O1 of AND gate AG disappears so that the brakes are applied to stop the vehicle.

Alternatively, let us assume that no coded command signal is being received on board so that none of the three amplifier-rectifiers is drawing current through the resistor R1. Under this condition, the second transistor Q2 of the differential amplifier is turned ON heavily, namely, saturated, and Q1 is turned OFF, so that the a.c. signals induced in the secondary winding become ineffective, and no a.c. signals are developed on collector electrode c1. If no coded command signal appears within five (5) seconds, the output signal on terminal O1 disappears and the brakes of the vehicle are applied.

It will be appreciated that any critical component or circuit failure results in an imbalance between the voltage-drops on resistors R1 and R6 or destroys the integrity of the circuit which will result in the loss of the brake release signal and cause a brake application. Thus, the presently-described biasing checking circuit operates in a fail-safe manner in that no foreseeable critical component or circuit failure is capable of causing a false or unsafe condition. That is, an unsafe malfunction will not produce an output signal on terminal O1 when more than one or none of the amplifier-rectifiers is energized.

Thus, the present invention has been described in such full, clear, concise and exact terms as to enable any person skilled in the art to which it pertains to make and use the same, and having set forth the best mode contemplated of carrying out this invention I state that the subject matter, which I regard as being my invention, is particularly pointed out and distinctly claimed in what is claimed. It will be understood that variations, modifications, equivalents and substitutions for components of the above specifically-described embodiment of the invention may be made by those skilled in the art without departing from the spirit and scope of the invention as set forth in the appended claims.

Having thus described my invention, what I claim as new and desire to secure by Letters Patent, is:

1. A fail-safe checking circuit for assuring the presence of only a single input signal comprising, a differential amplifier having a pair of inputs and an output, said differential amplifier includes a pair of transistors, a pair of biasing networks, one of said pair of biasing networks is connected to the base electrode of one of said pair of transistors and the other of said pair of biasing networks is connected to the base electrode of the other of said pair of transistors, an a.c. signal inductively coupled to one of said pair of inputs to produce signal pulses on said output when the voltage drop across one of said pair of biasing networks is substantially equal to the voltage drop across the other of said pair of biasing networks, and one of said pair of biasing networks includes a resistor which senses the current drawn by a plurality of amplifier-rectifiers and wherein the current through said resistor is designed to be a definite amount to cause the voltage drops across said pair of biasing networks to be substantially equal only when current is drawn by one of said plurality of amplifier-rectifiers.

2. The fail-safe checking circuit, as defined in claim 1, wherein a transformer induces the a.c. signal into the base electrode of one of said pair of transistors.

3. The fail-safe checking circuit, as defined in claim 1, wherein said output is the collector electrode of the other of said pair of transistors.

4. The fail-safe checking circuit, as defined in claim 3, wherein said collector electrode is connected to an amplifier having its output connected to a diode rectifier which is connected to one input of a two-input AND gate.

5. The fail-safe checking circuit, as defined in claim 1, wherein said differential amplifier includes a pair of PNP transistors.

6. The fail-safe checking circuit, as defined in claim 1, wherein the conduction of two or more of said plurality of said amplifier-rectifiers causes the satura-tion of the other of said pair of transistors.

7. The fail-safe checking circuit, as defined in claim 1, wherein the nonconduction of all of said plurality of amplifier-rectifiers causes the saturation of the one of said pair of transistors.

8. A vital circuit for checking the reception of a single signal comprising, a differential amplifier having a pair of transistors, a voltage divider having a first and second biasing resistor connected to the input of one of said pair of transistors, an a.c. signal induced into the input of said one of said pair of transistors, a third biasing resistor connected to the input of the other of said pair of transistors, a plurality of current-drawing circuits connected to said third biasing resistor, and an output signal derived from said other of said pair of transistors when and only when one of said plurality of current-drawing circuits is drawing current through said third biasing resistor and in the absence of a critical component or circuit failure.

9. The vital circuit, as defined in claim 8, wherein a transformer induces the a.c. signal in the base electrode of said one of said pair of transistors.

10. A vital single speed signal checking circuit comprising, a balanced PNP transistor differential amplifier, a first and a second series-connected resistor, the base electrode of one transistor of said differential amplifier is connected to the junction point of said first and second resistors through a secondary winding of a transformer for forwardly-biasing said one transistor, the base electrode of the other transistor of said differential amplifier is connected to a third resistor for forwardly-biasing said other transistor, an a.c. signal from a primary winding of said, transformer is coupled to said base electrode of said one transistor for developing an a.c. output signal on the collector electrode of said other transistor when and only when one of a plurality of speed signals is picked up by one of a plurality of amplifier-rectifiers, the a.c. output signal is fed to an amplifier whose output is connected to a diode for rectification to provide a d.c. input to a two-input AND gate.

* * * * *

UNITED STATES PATENT AND TRADEMARK OFFICE
CERTIFICATE OF CORRECTION

PATENT NO. : 4,641,045
DATED : February 3, 1987
INVENTOR(S) : John O. G. Darrow

It is certified that error appears in the above-identified patent and that said Letters Patent are hereby corrected as shown below:

Column 6, claim 6, line 8, delete "satura-tion" and insert

--saturation--

Signed and Sealed this

Twenty-first Day of April, 1987

Attest:

DONALD J. QUIGG

Attesting Officer

Commissioner of Patents and Trademarks